(12) United States Patent
Lee et al.

(10) Patent No.: US 7,545,520 B2
(45) Date of Patent: Jun. 9, 2009

(54) SYSTEM AND METHOD FOR CD DETERMINATION USING AN ALIGNMENT SENSOR OF A LITHOGRAPHIC APPARATUS

(75) Inventors: Hyun-Woo Lee, Veldhoven (NL); Sami Musa, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 267 days.

(21) Appl. No.: 11/599,619

(22) Filed: Nov. 15, 2006

(65) Prior Publication Data
US 2008/0111995 A1    May 15, 2008

(51) Int. Cl.
*G01B 11/14* (2006.01)
(52) U.S. Cl. ...................................... 356/625
(58) Field of Classification Search ................. 356/401, 356/237.2–237.6, 499, 625, 636
See application file for complete search history.

(56) References Cited

U.S. PATENT DOCUMENTS

| 5,361,137 A * | 11/1994 | Aton et al. .................. 356/496 |
| 2007/0105029 A1* | 5/2007 | Ausschnitt .................... 430/30 |
| 2007/0114678 A1 | 5/2007 | Van Haren et al. | |
| 2007/0132996 A1 | 6/2007 | Van Haren et al. | |

OTHER PUBLICATIONS

Philippe Lalanne, et al., "Antireflection behavior of silicon subwavelength periodic structures for visible light", Nanotechnology 8, pp. 53-56 (1997).
Gaspar-Wilson et al., "Metrology of Etched Quartz and Chrome Embedded Phase Shift Gratings Using Scatterometry," Integrated Circuit Metrology, Inspection and Process Control IX, Proc. SPIE vol. 2439, Feb. 20-22, 1995, pp. 479-494.
Milner et al., "Stepper Focus Characterization Using Diffraction from Latent Images," Journal of Vacuum Science and Technology B, $2^{nd}$ Series, vol. 11, No. 4, pp. 1258-1266, Jul. 1993.
Hickman et al., "Use of Diffraction from Latent Images to Improve Lithography Control," Journal of Vacuum Science and Technology B, $2^{nd}$ Series, vol. 10, No. 5, pp. 2259-2266, Sep. 1992.

* cited by examiner

*Primary Examiner*—Tarifur Chowdhury
*Assistant Examiner*—Jonathan D Cook
(74) *Attorney, Agent, or Firm*—Sterne, Kessler, Goldstein & Fox P.L.L.C.

(57) ABSTRACT

A system and method for determining parameters such as critical dimension of a patterned structure and best focus condition of a lithographic apparatus, based on measurement of the intensity of a non-zero order of light diffracted from an experimental structure. The experimental structure includes a first array of lines and partially filled spaces having a period longer than the wavelength of the diffracted light. The experimental structure also includes a second array of lines and spaces, where the second array of lines and spaces comprise the partially filled spaces.

19 Claims, 4 Drawing Sheets

SYSTEM AND METHOD FOR CD DETERMINATION USING AN ALIGNMENT SENSOR OF A LITHOGRAPHIC APPARATUS

RELATED APPLICATIONS

1. Field

The present invention relates to an alignment method and substrate, particularly a method and substrate for use in a lithographic apparatus.

2. Background

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The pattern is transferred onto several successive resist layers on the substrate in order to build up a multi-layer structure with the pattern throughout its thickness. It is therefore important to ensure that the pattern in any given layer is exactly aligned with the pattern in the previous layer. Specifically, a substrate is covered with a layer of resist and then the pattern is transferred onto that layer (by a process known as "exposure"). The layer is then treated post-exposure such that the resist is removed except where the pattern was exposed. A subsequent layer of resist is then applied and the pattern transferred/exposed again and treated post-exposure again. This happens several tens of times, depending on the resist and the pattern. Each time a new resist layer is to be exposed, the pattern is carefully aligned with the pattern of the previous resist layer in order to have a well-defined overall pattern at the end of the series of exposures and post-exposure treatments. The way that successive patterned layers are aligned is by having alignment marks in the layer, these alignment marks being detectable by an alignment beam that is projected by the projection system before the exposure beam is projected to apply the pattern.

As lithographic techniques improve and smaller patterns are possible, measurements such as critical dimension (CD) measurement become increasingly difficult and time consuming.

SUMMARY

It is desirable to create a system and method that provide a more convenient method to measure small features, such as the so-called critical dimension or CD of features in a patterned substrate.

According to an aspect of the invention, there is provided a system and method for measuring a critical dimension of a patterned feature in a structure provided on a substrate. The system includes a light source configured to provide a beam of light incident on the substrate. In one configuration, the beam of light is a Tm or Te polarized beam of light having a wavelength larger than the critical dimension. The system includes a light sensor configured to detect an intensity of light reflected from a patterned structure on the substrate. The structure can be formed in a layer disposed on a surface of the substrate or can be formed within the substrate itself. In one implementation, the light sensor is an alignment sensor configured to detect a position of an alignment mark in a substrate. In one configuration the patterned structure includes a phase depth grating that provides a regular array of features in at least one dimension, such as a regular array of lines and spaces. The patterned structure includes a super-wavelength grating that provides in one or more directions a regular array of features having a pitch that exceeds the wavelength of the beam of light, and further includes a sub-wavelength grating that comprises a regular array of features and spaces wherein the pitch of the array is smaller than the wavelength of the beam of light. The sub-wavelength grating is configured such that all the propagating diffraction orders of the incident light cease to exist except for the zero order. The sub-wavelength grating behaves effectively like a slab layer with an effective refractive index that depends on duty cycle of the patterned lines in the sub-wavelength grating. The system includes a processor configured to receive a signal related to the detected intensity of light reflected from a reference structure that includes a super-wavelength grating having a first pitch and first duty cycle and does not include a sub-wavelength grating, the processor further configured to receive a signal related to the detected intensity of light reflected from an experimental structure that includes a super-wavelength grating having the first pitch and the first spacing dimension, and further includes a sub-wavelength grating having a second pitch that is less than the wavelength of the light beam. The processor is further configured to compare the intensity of light detected from the first grating and second grating and to calculate the critical dimension of features in the sub-wavelength grating according to the detected intensity, the grating depth and the first duty cycle.

In one aspect of the invention, a method for determining feature size in a patterned substrate comprises providing a beam of radiation incident on a patterned structure (experimental structure) provided in the substrate. In one implementation, the patterned structure is a patterned photoresist layer provided on a substrate. The patterned structure includes a super-wavelength grating that provides in one or more directions a regular array of features having a pitch that exceeds the wavelength of the beam of light, and further includes one or more sub-wavelength gratings that each comprises a regular array of features and spaces wherein the pitch of the array is smaller than the wavelength of the beam of light. The sub-wavelength grating is configured such that all the propagating diffraction orders of the incident light cease to exist except for the zero order. Light is reflected from a surface of the experimental structure. An intensity of the light reflected from the experimental structure is detected. The intensity of light reflected from the experimental structure is compared to the intensity of light detected from a reference structure, wherein the reference structure includes a super-wavelength grating having a first pitch and first duty cycle and does not include the sub-wavelength grating. A critical dimension associated with the sub-wavelength grating is determined based on the compared intensities of light reflected from the experimental and reference structures, the structure depth and the first duty cycle.

According to another aspect of the invention, there is provided a means for determining a focus condition in a lithographic apparatus, comprising providing a series of experimental structures on a substrate, each experimental structure comprising a first array of features characterized by a first pitch and a first duty cycle, and comprising a second array of features characterized by a second pitch smaller than the first pitch, each experimental structure associated with a respective focus position; providing a first beam of radiation incident on each of the experimental structures, the first beam characterized by a first wavelength larger than the second pitch and smaller than the first pitch; detecting a series of intensities of a non-zero order of light produced by diffraction of the first beam from each of the experimental structures; and determining a focus position associated with an experimental structure that produces a minimum detected intensity.

According to another aspect of the invention, there is provided a method for measuring a feature dimension in a patterned substrate, comprising providing an experimental structure on a substrate, the experimental structure comprising a first array of features having a first pitch and a first duty cycle, and comprising a second array of features having a second pitch smaller than the first pitch; providing a first beam of radiation incident on the experimental structure, the first beam having a first wavelength larger than the second pitch and smaller than the first pitch; detecting an intensity of a non-zero order of light produced by diffraction of the first beam from the experimental structure; detecting an intensity of the non-zero order of light produced by diffraction from a reference structure of a second beam that is substantially the same as the first beam; and determining a critical dimension of the second array of features based upon the detected intensities and the first pitch.

According to another aspect of the invention, there is provided a system for determining a critical dimension of a feature in a patterned substrate, comprising a light source configured to provide a first beam of light incident on the substrate, the first beam of light having a wavelength larger than the critical dimension; a light sensor configured to detect an intensity of a non-zero order of light received from the first beam after diffraction from an experimental structure on the substrate, wherein the experimental structure comprises a super-wavelength grating that provides a first array of features having a first duty cycle and having a first pitch that exceeds the wavelength of the beam of light, and further includes at least one sub-wavelength grating that comprises a second array of features and spaces having a second pitch that is smaller than the wavelength of the beam of light, the light sensor further configured to detect an intensity of light diffracted from a non-zero order of light received from a second beam substantially the same as the first beam after diffraction from a reference structure on the substrate, wherein the reference structure comprises a super-wavelength grating substantially the same as the super-wavelength grating of the experimental structure but does not comprise the sub-wavelength grating; and a processor configured to compare an intensity of a non-zero order of light diffracted from the experimental grating and the reference grating and to calculate the critical dimension of features in the sub-wavelength grating according to the detected intensities, a grating depth, and the first pitch.

According to another aspect of the invention, there is provided a method of determining a best focus in a lithographic apparatus, comprising providing a series of experimental structures on a substrate, each experimental structure comprising a first array of features having a first pitch and a first duty cycle, and comprising a second array of features having a second pitch smaller than the first pitch, each experimental structure associated with a respective focus position; providing a first beam of radiation incident on each of the experimental structures, the first beam having a first wavelength larger than the second pitch and smaller than the first pitch; detecting a series of intensities of a non-zero order of light produced by diffraction of the first beam from the experimental structures; and determining a focus position associated with an experimental structure within the series of experimental structures that produces a minimum detected intensity.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
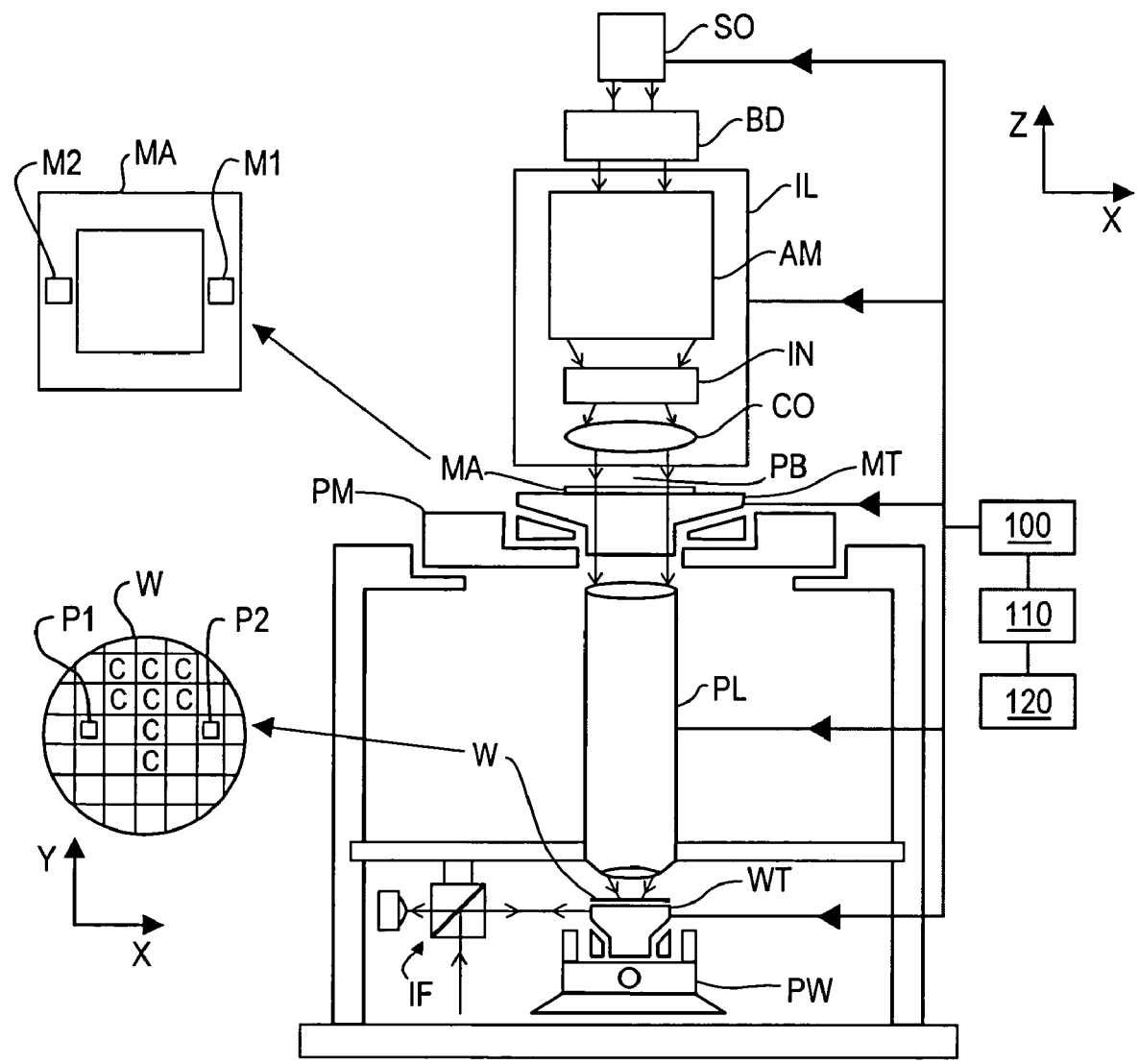
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or visible light radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Small dimensions associated with device features and other patterned features in a substrate should be measured in a manner that facilitates convenient collection of data. For example, secondary electron microscopy can be used to determine accurate dimensions of lines or other small patterned features representative of the critical dimension.

The present invention uses the fact that the substrate exposure wavelength in a lithographic apparatus can be much smaller than the alignment wavelength used to measure alignment. An alignment wavelength may be infra-red or visible light, for example (i.e. any wavelength that will not affect the resist layers on the substrate), while an exposure wavelength is usually ultra-violet or a similar wavelength.

Sub-wavelength periodic arrays of structures may therefore be created on the substrate that will be detectable by the alignment beam, but not by the exposure beam. Such periodic arrays act as artificial crystals for the alignment wavelength. The macroscopic optical properties of such a crystal, for example, the effective real and imaginary parts of the refractive index, can be controlled accurately by the shape of the structure and the periodicity of the arrays. This means that the macroscopic optical properties of the substrate may be tailored for the alignment wavelength. In particular, the alignment beam may be caused to scatter with a specific scatter spectrum when the alignment mark is aligned with the projection system transmitting the alignment beam. The tailoring of the optical properties of the substrate is a consequence of the fact that the wavelength of the exposure beam is (much) smaller than the wavelength of the alignment beam. Therefore, patterned structures formed in a substrate by the exposure beam can include arrays of features whose periodicity is smaller than the wavelength used for an alignment sensor. These patterned features appear to the alignment beam as a homogeneous medium whose optical properties can be varied, by varying such parameters as the fill factor of a feature array. Thus, by varying the sub-wavelength features the alignment properties can be altered. In addition, the intensity of light scattered from a periodic structure larger than the light wavelength can be altered by changing the sub-wavelength features, as described below.

Figure 2:
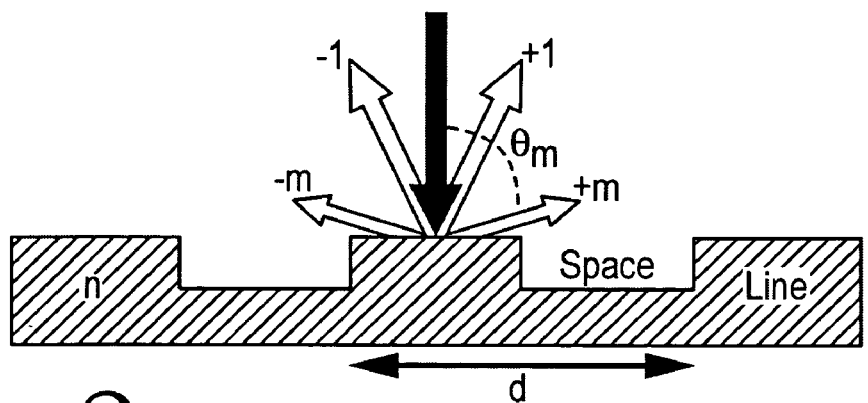
FIG. 2 depicts the geometry for diffraction of a light beam from a grating structure.

More information on how this sort of structure may be made may be found in "Antireflection behavior of silicon subwavelength periodic structures for visible light", Lalanne and Morris, Nanotechnology 8 (1997) 53-56, hereby incorporated by reference. When an optical beam falls on a regularly corrugated surface, such as a grating, as depicted in FIG. 2, it is scattered into distinct directions called diffraction orders. From the scalar theory of diffraction, the angle that each order makes with the normal to the grating surface (the diffraction angle) is given by 2nd sin θm=mλ where m is an integer number indicating the diffraction order, 1 is the wavelength of the incoming beam, qm is the mth-order diffraction angle, n is the refractive index of the grating medium and d is the pitch of the grating.

Figure 3:
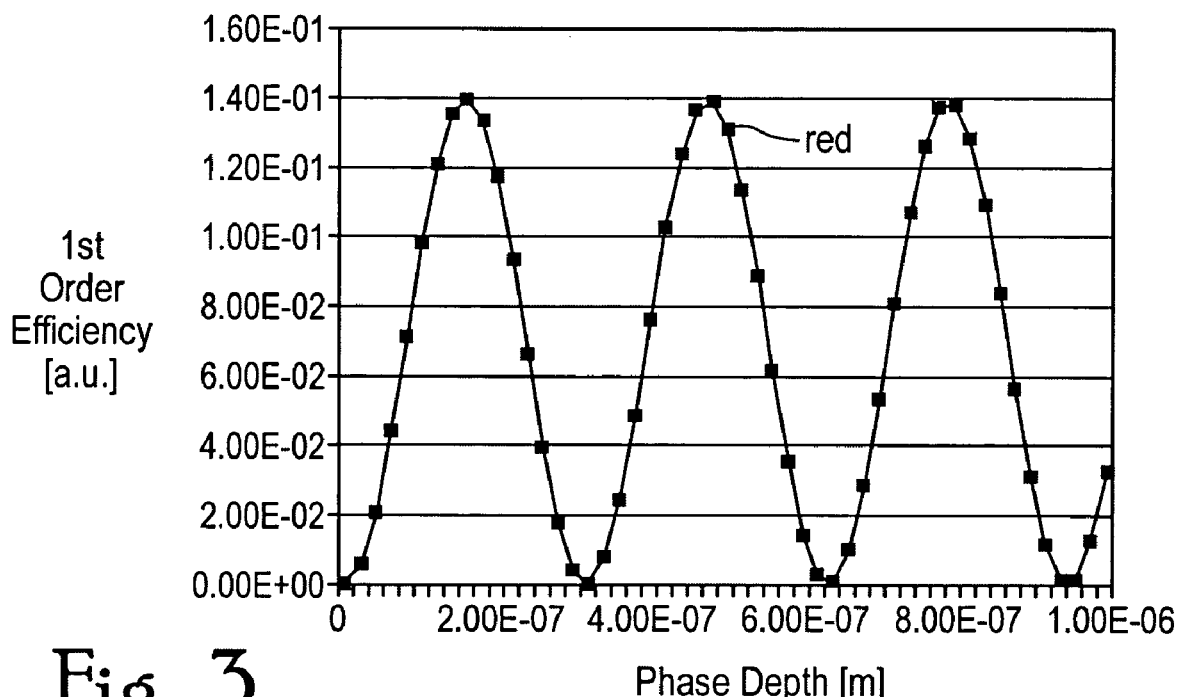
FIG. 3 is a graph that depicts the simulation of detection efficiency for a first diffraction order of light diffracted as a function of phase depth of a conventional grating, such as that depicted in FIG. 2.

As shown in FIG. 3, which illustrates a swing curve, the intensity of light reflected from such a grating depends on the depth t (also termed height) of the grating features and the wavelength of the light. This is usually expressed as a "phase depth," which is plotted along the x-axis of FIG. 3. The detection efficiency versus phase depth of a grating etched onto a silicon wafer is simulated using software that employs rigorous coupled wave analysis RCWA. The wavelength used in the simulation is 632.8 nm. The grating period is 16-microns and the refractive index of the silicon substrate is 3.85-i0.05. The curve shows that the detected signal strength depends on the phase depth of the grating. As the phase depth increases, the signal strength goes through a series of oscillations.

In the limit for a grating pitch d, where d<λ (sub-wavelength grating), all propagating diffraction orders, with the exception of the zero order, become non-propagating (evanescent) waves. Such a grating behaves effectively as a slab with an effective dielectric constant that is determined by the values of the dielectric constants of the materials constituting the grating and by its geometry. For a given sub-wavelength pitch, the effective dielectric constant of the slab formed by the grating can be tailored by changing the duty cycle of the grating. Sub-wavelength gratings offer a new class of artificial materials. These materials have the property that their refractive indices, real and imaginary, can be tuned by adjusting the geometrical parameters of the gratings, such as duty cycle.

Figure 4:
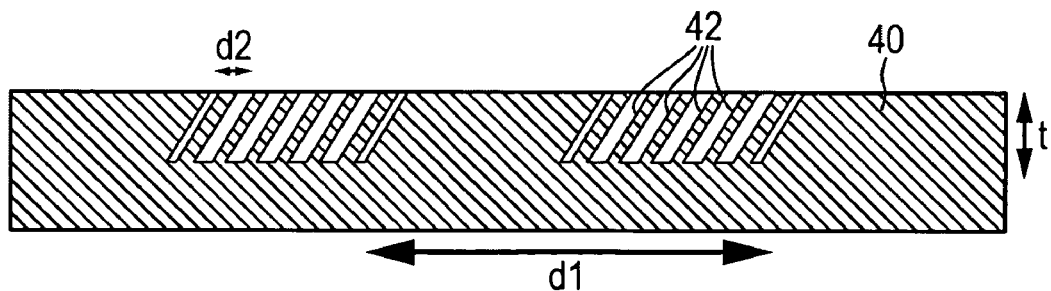
FIG. 4 depicts a grating structure arranged according to one embodiment of the present invention.

For instance, by applying sub-wavelength segmentation into the spacing of a grating 40, as shown in FIG. 4, the effective refractive index and consequently the optical path length in the spaces of the grating changes. The term "sub-wavelength segmentation" or "sub-wavelength grating" as used herein, generally refer to forming a regular array of features whose pitch is too small to be "seen" by light of a wavelength. The segments, or grating, may be an array of lines and spaces. In some cases, the lines themselves may be segmented orthogonal to the line direction. As depicted in FIG. 4, the lines are inclined at an angle with respect to normal, but more generally can be arranged normal to the plane of the grating. The "sub-wavelength segmentation" in this case comprises a series of lines 42 and spaces having a pitch d2 and arranged in the "spaces" portion of a larger array whose period is d1. The "spaces" of the larger array are thus in actuality partially filled spaces that are filled with a series of smaller lines and spaces.

In the so-called saturation region, where the period d is much smaller than the wavelength λ of the incident light, the grating can be considered as a homogenous medium. For a given sub-wavelength period (d2 in FIG. 4) the effective refractive index "seen" by the incident light varies as a function of filling factor f (defined as the linewidth or feature width divided by the period) or duty cycle, 1-f. By applying sub-wavelength segmentation in the spaces (or the lines) of a grating, the optical path length in this region changes, so that the frequency and the amplitude of the swing curve also changes. The change of the effective refractive index is additionally sensitive to the polarization state of incident light.

Figure 5:
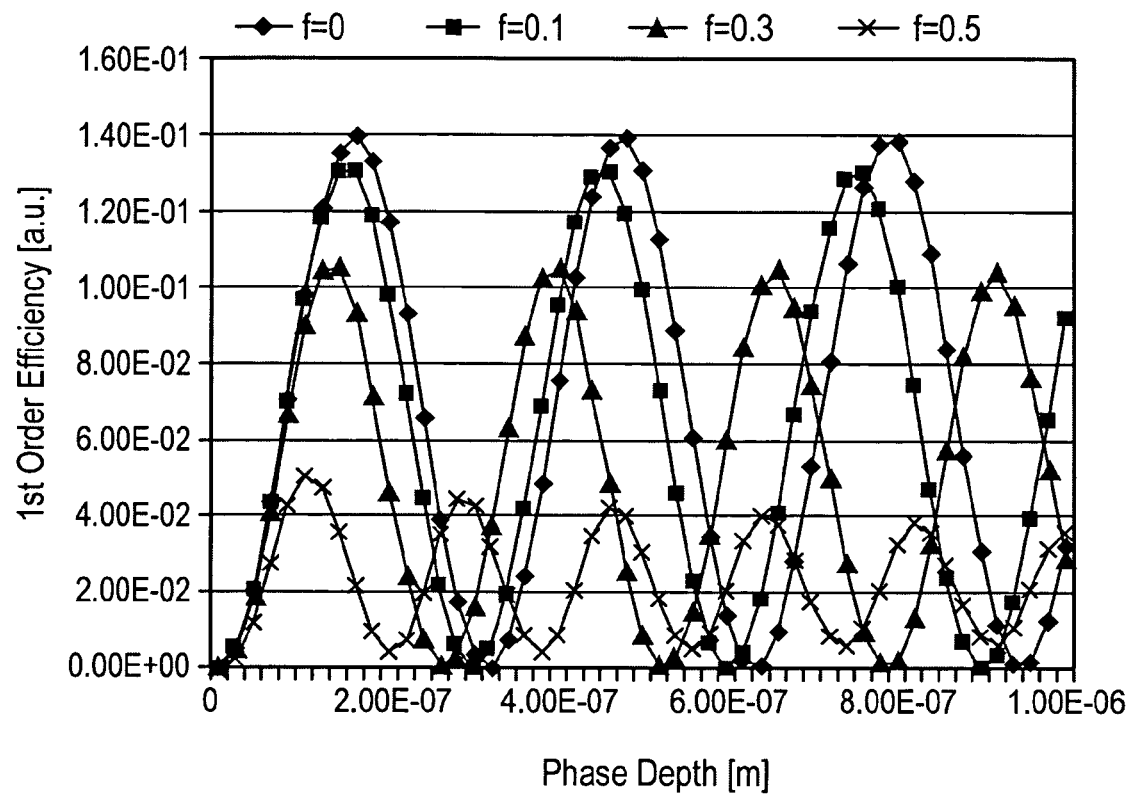
FIG. 5 is a graph that depicts the simulation of detection efficiency for a first diffraction order of light diffracted as a function of phase depth and fill factor of a grating structure arranged in accordance with embodiments of the present invention, and generally depicted in FIG. 4.

FIG. 5 shows various swing curves produced by simulating sub-wavelength segmented 16-micron gratings, etched onto a silicon substrate. In other words, the structures whose simulated data is shown in FIG. 5, include a super-wavelength grating (a conventional grating where the grating pitch is larger than the incident light wavelength used to measure the grating) and a sub-wavelength regular array of features, for example, one or more sub-wavelength linear gratings (the segmented regions), that have a pitch smaller than the wavelength of the incident light (see FIG. 4). Thus, the structures whose reflection data is shown in FIG. 5 are dual-grating structures in which a grating with a smaller pitch is contained within a feature of the longer pitch grating, such as the partially filled "space" between lines.

The refractive index of the silicon taken in these simulations is 3.85-i0.05 and that of air is 1. The wavelength of the incident light is 632.8 nm and it is TM-polarized. In the figure the diamond-symbol curve is the simulated swing curve of the non-segmented grating, the square, triangle and cross curves represent swing curves of segmented gratings with a filling factor in the segmented region of 0.1, 0.3 and 0.5, respectively. The filling factor, or duty cycle, denotes the line width, or feature width in a given direction, divided by the feature period, or pitch, in the given direction. For example, the simulated structure can be a super-wavelength linear grating (also termed "array" hereinafter) having a pitch of 16 microns, a linewidth of 8 microns for an array of photoresist lines on a silicon substrate, and a line spacing region between photoresist lines of 8 microns. In one example, the line "spacing" region itself is a sub-wavelength array of photoresist lines and spaces (see FIG. 4). A filling factor of zero indicates that the linewidth of the sub-wavelength array is zero (that is, there is no sub-wavelength array). As the filling factor increases, the linewidth for a given sub-wavelength grating increases, because the pitch is fixed.

As illustrated in FIG. 5, the frequency of the swing curve increases and the amplitude of the swing curve decreases as the filling factor increases. The change in the frequency of the swing curve, which can be utilized in embodiments of the present invention, is caused by the change in the effective refractive index in the segmented region. The drop in the amplitude of the swing curve is associated with the increase of the effective refractive index in the segmented region as the filling factor increases. The decrease in the amplitude is caused mainly by reflection and transmission that take place at the top and bottom interfaces of the segmented region. Accordingly, by measuring an intensity of an order of light (the order being greater than zero) reflected from a dual pitch grating (that includes a sub-wavelength grating) arranged in accordance with embodiments of this invention, information concerning the filling factor of the sub-wavelength grating can be obtained, as explained in detail in the discussion to follow. Determination of the fill factor leads directly to determination of the linewidth (for the purposes of this discussion, the short dimension will be referred to as the "critical dimension" or CD, which is typically a dimension associated with smaller features in a device structure and may be specified as a design parameter) or CD, since the pitch of the subwavelength grating can be designed in advance and also measured independently by a tool such as an SEM.

Thus, in embodiments of the present invention, a simple method and system is provided for determining critical dimension of patterned features using a light sensor, such as an alignment sensor in a lithography tool.

In accordance with one embodiment of the present invention, a method for determining the critical dimension in a patterned structure provided on a substrate includes the step of providing a beam of radiation incident on the patterned structure (experimental structure) provided in the substrate. In one implementation, the patterned structure is a patterned photoresist layer provided on a substrate. The beam of radiation may be a light beam used to provide alignment measurements in a lithography apparatus.

The patterned structure includes a super-wavelength grating that provides in one or more directions a first array of features having a pitch that exceeds the wavelength of the beam of light, and further includes a sub-wavelength grating that comprises a second array of features and spaces, wherein the pitch of the second array is smaller than the wavelength of the beam of light. For example, the super-wavelength grating could comprise a pattern of an alignment mark that is used to align the substrate with respect to a reticle stage provided in a lithographic apparatus. The sub-wavelength grating is configured such that all the propagating diffraction orders of the incident light cease to exist except for the zero order. Light is reflected from a surface of the experimental structure. An intensity of the light reflected from the experimental structure is detected. The intensity of light reflected from the experimental structure is compared to the intensity of light detected from a reference structure, wherein the reference structure includes a super-wavelength grating having a first pitch and first duty cycle and does not include the sub-wavelength grating. In one example, the reference structure is a conventional substrate alignment mark. A critical dimension associated with the sub-wavelength grating is determined based on the compared intensities of light reflected from the experimental and reference structures, the structure depth and the first duty cycle.

In one embodiment of the present invention, the critical dimension of the subwavelength grating is determined by first calculating an effective refractive index of the sub-wavelength portion of the patterned structure. The effective refractive index, $n_{eff}$ is calculated from $$I\exp = Iref \frac{R}{R_{silicon}} \frac{\text{Sin}^2(DC \cdot m \cdot \pi)}{m} \text{Sin}^2\left(\frac{2\pi}{\lambda} \cdot n_{eff} \cdot t\right), \quad \text{Eq. 1}$$

where:

$I\exp$: measured intensity $Iref$: measured…reference…intensity $R$: Reflectivity of the deposited layer (resist)

$R_{silicon}$: Substrate reflectivity $\lambda$: Wavelength $DC$: Duty Cycle of larger grating $m$: Measured…light…Diffraction order $t$: Mark Depth $n_{eff}$: Refractive index of sub-wavelength segmented spaces of the grating In equation 1, $I_{exp}$ is the measured intensity of light reflected from the experimental structure, and $I_{ref}$ is the measured intensity of light reflected from the reference structure. DC, the duty cycle of the super-wavelength grating, can be determined by measurement or from design rules. The mark (experimental structure) depth t can be experimentally measured by known methods. For example, if the experimental structure is formed in a layer of resist deposited on a silicon substrate, the depth t corresponds to the height t of patterned features in the resist, as illustrated in FIG. 4. The reflectivity R of the deposited layer is determined according to:

$$R = \left[\frac{n_f - n_0}{n_f + n_0}\right]^2, R_{silicon} = \left[\frac{n_s - n_{eff}}{(n_s + n_{eff})}\right]^2 \qquad \text{Eq. 2}$$

$n_{eff}$: Effective refractive index of segmented region $n_f$: Refractive index of the deposited film(resist)

$n_0$: Refractive index of superstrate[air]

$n_s$: Refractive index of substrate

The refractive index parameters $n_f$, $n_0$, and $n_s$ are known or can be determined by standard measurement techniques. Accordingly, when Eq. 2 is substituted into Eq. 1, $n_{eff}$ is the only unknown parameter. Thus, $n_{eff}$ can be determined in a straightforward manner by measurement of the reflected light intensity from the reference and experimental structures.

In one embodiment of the present invention, determination of the critical dimension of a feature in a sub-wavelength grating from the calculated $n_{eff}$ is given by $$n_{eff,TE} = \left\{n_{0,TE}^2 + \frac{1}{3}\left[\frac{\Lambda \pi F}{\lambda}(1-F)(n_f^2 - n_0^2)\right]^2\right\}^{1/2} \qquad \text{Eq. 3}$$

$$n_{eff,TM} = \left\{n_{0,TM}^2 + \frac{1}{3}\left[\frac{\Lambda \pi F}{\lambda} n_{0,TM}^3 n_{0,TE}(1-F)\left(\frac{1}{n_f^2} - \frac{1}{n_0^2}\right)\right]^2\right\}^{1/2}$$

where $$n_{0,TE} = [Fn_f^2 + (1-F)n_0^2]^{1/2}$$

$$n_{0,TM} = \left[\frac{(n_0 n_f)^2}{Fn_0^2 + (1-F)n_f^2}\right]^{1/2}$$

F is filling factor which is equal to F =

CD / pitch (sub-wavelength pitch) $n_{eff,TM} n_{eff,TE}$ are the effective refractive indices for TE and TM polarized alignment beam which can be obtained from eqn-1 and eqn-2.

Accordingly, in alternative embodiments of the present invention, a TE or TM polarized light beam can be provided as the incident light beam used to diffract from the experimental structure. As is evident from Eq. 3, the fill factor parameter F(=CD/pitch) is directly calculated from $n_{eff}$ since $n_f$ and $n_0$ are known. Since the pitch of the sub-wavelength grating is generally known or can be independently measured, Eq. 3 leads directly to determination of CD from knowledge of $n_{eff}$.

Thus, embodiments of the present invention provide both a system and method for in-situ measurement of critical dimension of patterned features produced in a lithography apparatus. In other words, sub-wavelength (with respect to an alignment sensor radiation wavelength) features can be patterned by using a short wavelength radiation source from a projection system of a lithographic apparatus, such as a 248 nm, 193 nm, or 157 nm excimer laser source. The CD of such features can then be measured in the same apparatus by using a 633 nm radiation source in an alignment sensor, for example.

In another embodiment of the present invention, a method for determining a best focus condition of a lithographic apparatus includes the steps outlined above for measuring diffracted intensity of light incident or an experimental structure that includes a sub-wavelength grating contained within a super-wavelength grating. A radiation sensor such as an alignment sensor is provided to detect the radiation intensity of an order of light diffracted from a series of experimental structures. As explained in detail below, the series of experimental structures can be produced by a projection beam of radiation in a lithographic apparatus that is subject to a series of different operating conditions, for example, different focus conditions. Based on the experimental radiation intensity measurements of the diffracted order of light from the series of experimental structures, the best focus condition can be determined.

Figure 6:
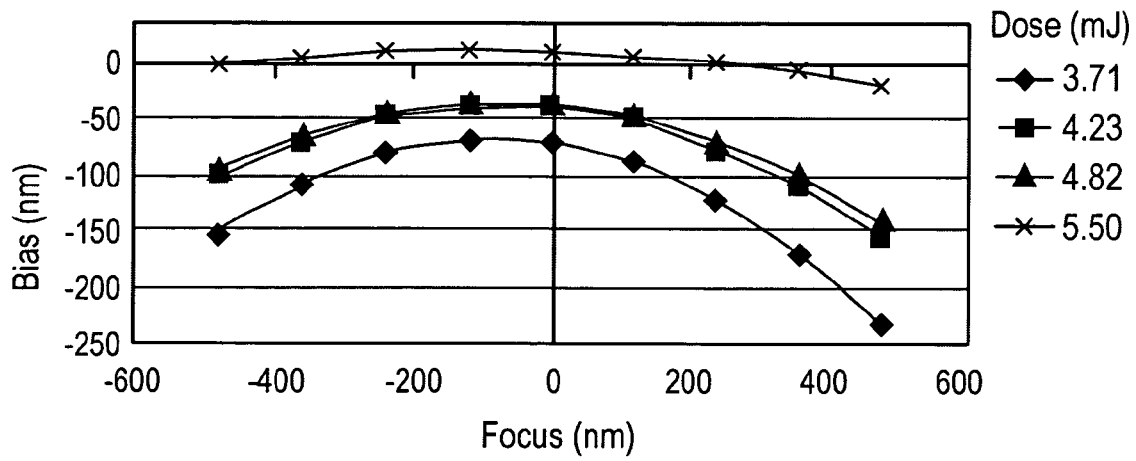
FIG. 6 depicts typical Bossung curves that describe linewidth dimensional bias for lines printed in a structure as a function of focus position for various exposure doses.

FIG. 6 illustrates a conventional Bossung plot which displays data that plots linewidth (bias) variation as a function of focus condition for lines produced by a lithographic apparatus (typically the focus is plotted as a distance, which is usually the direction orthogonal to the reticle and substrate stage, that is, the z-direction). A series of lines are plotted, where each line represents a different exposure dose. The bias represents a deviation from a nominal dimension, but could also be plotted as an absolute dimension of a linewidth. As is evident, the linewidth bias reaches a minimum at a certain focus position, which can be defined as a zero condition. The negative bias can be the equivalent of a linewidth that is larger than the nominal value. Near focus=0 (the best focus condition) the linewidth negative bias is minimal, indicating that the absolute linewidth reaches a minimum dimension. At other values of focus, the bias becomes negative, indicating an increase in linewidth. Thus, if the data from FIG. 6 is taken as representative of linewidth behavior of a diffraction grating as a function of experimental lithography conditions, the diffraction grating has a minimum linewidth at the experimental condition where focus=0. If this experimental lithography condition is taken to be the best focus condition, then the best focus condition (setting) in a lithography apparatus can be determined based on the measured linewidth.

Conventional linewidth measurements to determine CD can be employed to generate curves such as those shown in FIG. 6. However, as discussed above, CD can be determined from the measurement of intensity of a diffracted order of light received at a light sensor from a super-wavelength grating that includes a sub-wavelength grating. Thus, in accordance with one embodiment of the present invention, a series of experimental dual grating structures are produced using a short wavelength radiation source, such as a DUV excimer laser source. The series of structures are printed at a series of different x-y positions in a substrate, where the focus/dose used to expose the substrate is varied between substrate positions. The best focus condition is determined based on a predetermined criterion, such as the position that produces (for a fixed exposure dose) the minimum linewidth (CD), as determined from the measured intensity at the light sensor.

Figure 7B:
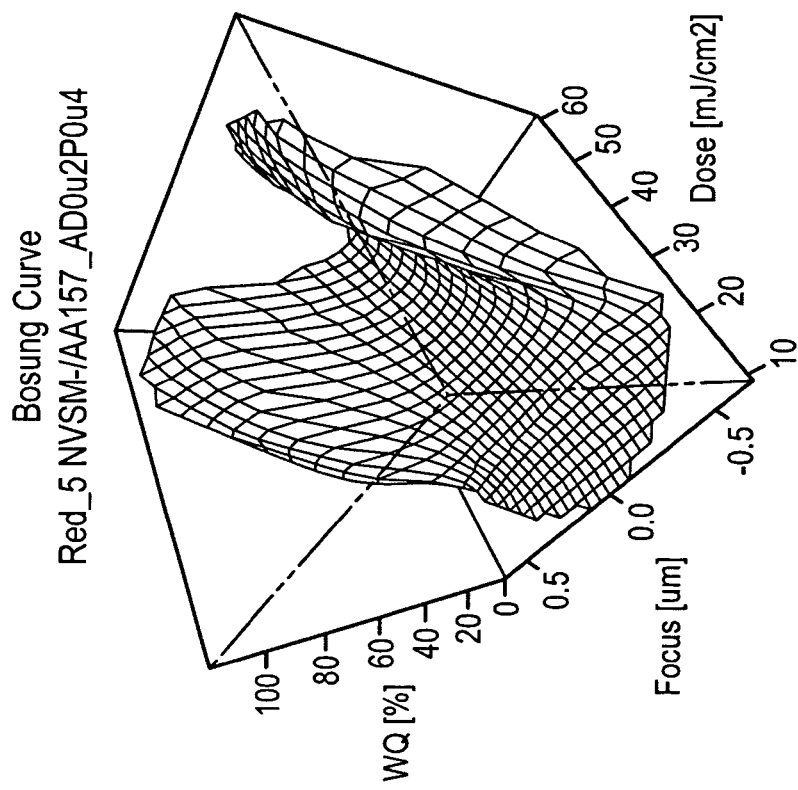
FIGS. 7A and 7B depicts a planar and 3-D plot illustrating the variation of detected intensity of an order of light diffracted from a grating structure arranged according to an embodiment of the present invention, as a function of both exposure dose and focus position.
Figure 7A:
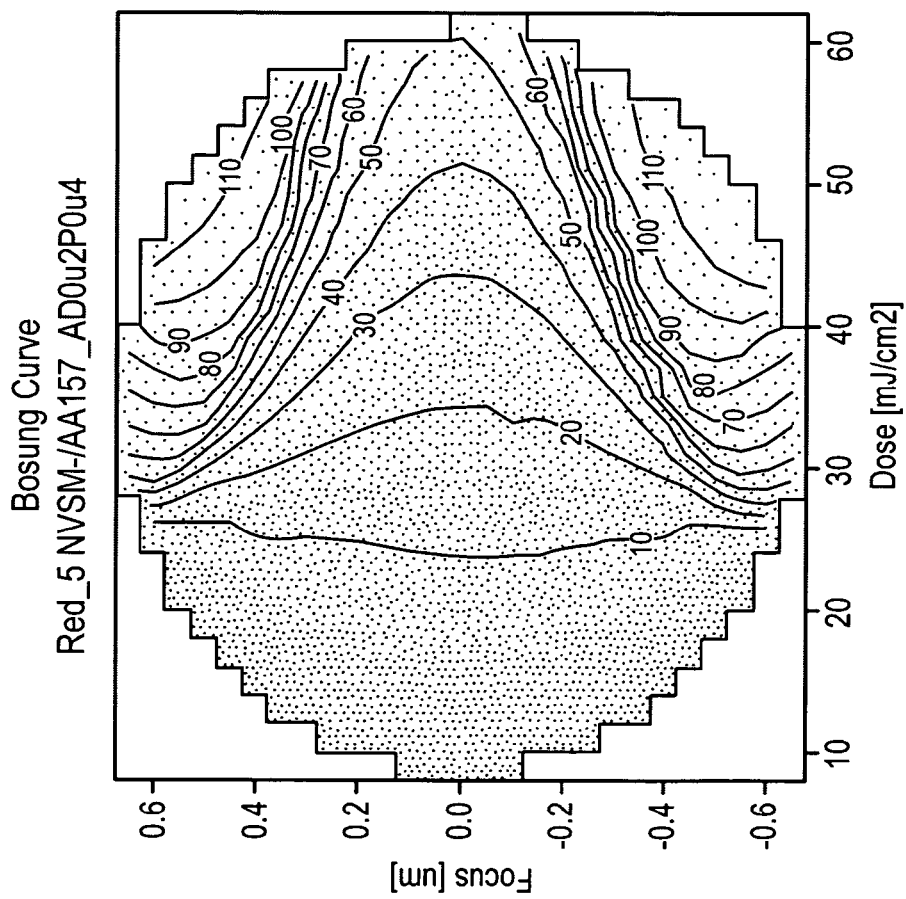

This procedure can be used for a series of focus conditions at a series of different exposure doses to produce a two-dimensional focus-exposure matrix that provides intensity measurements received from light diffracted from a dual-grating structure that includes a subwavelength grating (also termed sub-wavelength segmentation). In one embodiment of the present invention, the variation of detected intensity can be used to determine a best focus condition, without quantitative determination of CD as illustrated in FIGS. 7A and 7B. FIGS. 7A and 7B plots detected intensity at an alignment sensor for light diffracted from a series of alignment gratings that include sub-wavelength segmentation. The intensity is plotted as a function of both exposure dose and focus position used to produce a given alignment grating in a substrate. As is evident, the intensity (shown as WQ) reaches a minimum around a focus condition designated as 0. On either side of zero focus distance, the detected intensity increases. The detected intensity increase corresponds to a smaller duty cycle and accordingly a larger CD, since the pitch value is fixed. Accordingly, the absolute value of CD need not be measured in order to empirically determine a best focus condition in a lithographic apparatus. Rather, a series of dual-grating structures can be produced over a series of focus positions, and the best focus condition determined based on the position that produces the minimum diffracted intensity.

In FIGS. 7A and 7B, the lines are subsegmented, but not the spaces. In another embodiment, the spaces may be subsegmented, in which case we would get essentially the same curve, but inverted. This would represent a maximum detected intensity rather than a minimum detected intensity.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method for measuring a feature dimension in a patterned substrate, comprising;
    providing an experimental structure on a substrate, the experimental structure comprising a first array of features having a first pitch and a first duty cycle, and comprising a second array of features having a second pitch smaller than the first pitch;
    providing a first beam of radiation incident on the experimental structure, the first beam having a first wavelength larger than the second pitch and smaller than the first pitch;
    detecting an intensity of a non-zero order of light produced by diffraction of the first beam from the experimental structure;
    detecting an intensity of a non-zero order of light produced by diffraction from a reference structure of a second beam that is substantially the same as the first beam; and
    determining a critical dimension of the second array of features based upon the detected intensities and the first pitch.

2. The method of claim 1, wherein the experimental structure and the reference structure comprise patterned photoresist disposed on the substrate.

3. The method of claim 1, wherein the detecting of the intensity of non-zero order of light produced by diffraction from the experimental structure and from the reference structure is performed by an alignment sensor.

4. The method of claim 3, wherein the first beam and the second beam are one of a TM polarized beam of light and a TE polarized beam of light.

5. The method of claim 4, wherein the first wavelength is greater than about 500 nm.

6. The method of claim 1, wherein the first array of features comprises a plurality of first lines that are separated by partially filled spaces, wherein the second array of features comprise a plurality of second lines and second spaces, the plurality of second lines and second spaces located within the partially filled spaces.

7. The method of claim 1, wherein the first beam is a TM polarized beam and a critical dimension (CD) is determined from an effective refractive index $n_{eff}$ of partially filled spaces, according to $$n_{eff.} = \left\{ n_{0,TM}^2 + \frac{1}{3}\left[\frac{\Lambda\pi F}{\lambda} n_{0,TM}^3 n_{0,TE}(1-F)\left(\frac{1}{n_f^2} - \frac{1}{n_0^2}\right)\right]^2 \right\}^{1/2}$$

where $$n_{0,TM} = \left[\frac{(n_0 n_f)^2}{Fn_0^2 + (1-F)n_f^2}\right]^{1/2}$$

where F=CD/second pitch, where $n_0$ is the refractive index of air, and $n_f$ is the refractive index of layer containing the experimental structure.

8. The method of claim 1, wherein the first beam is a TE polarized beam and a critical dimension (CD) is determined from an effective refractive index $n_{eff}$ of partially filled spaces, according to $$n_{eff.} = \left\{ n_{0,TE}^2 + \frac{1}{3}\left[\frac{\Lambda\pi F}{\lambda}(1-F)(n_f^2 - n_0^2)\right]^2 \right\}^{1/2}$$

where

-continued $$n_{0,TE} = [Fn_f^2 + (1-F)n_0^2]^{1/2}$$

where F=CD/second pitch.

9. The method of claim 7, wherein $n_{eff}$ is determined according to $$Iexp = Iref \frac{R}{R_s} \frac{\mathrm{Sin}^2(DC \cdot m \cdot \pi)}{m} \mathrm{Sin}^2\left(\frac{2\pi}{\lambda} \cdot n_{eff} \cdot t\right),$$

where Iexp is a detected intensity produced by the first beam diffracted from the experimental structure, where Iref is a detected intensity produced by the second beam diffracted from the reference structure, where R is a reflectivity of a layer containing the experimental structure, where Rs is a reflectivity of the substrate, where DC is a duty cycle of the first array of features, where m is the non-zero order, where t is a depth of the experimental structure, and where λ is the first wavelength.

10. The method of claim 9, where R is determined according to $$R = \left[\frac{n_f - n_0}{n_f + n_0}\right]^2,$$

where Rs is determined according to $$R_s = \left[\frac{n_s - n_{eff}}{(n_s + n_{eff})}\right]^2,$$

where $n_f$ is the refractive index of the layer containing the experimental structure, where $n_0$ is the refractive index of air, and where $n_s$ is the refractive index of the substrate.

11. The method of claim 8, wherein $n_{eff}$ is determined according to $$Iexp = Iref \frac{R}{R_s} \frac{\mathrm{Sin}^2(DC \cdot m \cdot \pi)}{m} \mathrm{Sin}^2\left(\frac{2\pi}{\lambda} \cdot n_{eff} \cdot t\right),$$

where Iexp is a detected intensity produced by the first beam diffracted from the experimental structure, where Iref is a detected intensity produced by the second beam diffracted from the reference structure, where R is a reflectivity of a layer containing the experimental structure, where Rs is a reflectivity of the substrate, where DC is a duty cycle of the first array of features, where m is the non-zero order, where t is a depth of the experimental structure, and where λ is the first wavelength.

12. The method of claim 11, where R is determined according to $$R = \left[\frac{n_f - n_0}{n_f + n_0}\right]^2,$$

where Rs is determined according to $$R_s = \left[\frac{n_s - n_{eff}}{(n_s + n_{eff})}\right]^2,$$

where $n_f$ is the refractive index of the layer containing the experimental structure, where $n_0$ is the refractive index of air, and where $n_s$ is the refractive index of the substrate.

13. The method of claim 1, wherein the first beam is a polarized beam, and wherein a critical dimension (CD) is determined from an effective refractive index of partially filled spaces, wherein the effective refractive index is determined by rigorous coupled wave analysis.

14. A system for determining a critical dimension of a feature in a patterned substrate, comprising:
a light source configured to provide a first beam of light incident on the substrate, the first beam of light having a wavelength larger than the critical dimension;
a light sensor configured to detect an intensity of a non-zero order of light received from the first beam after diffraction from an experimental structure on the substrate,
wherein the experimental structure comprises a super-wavelength grating that provides a first array of features having a first duty cycle and having a first pitch that exceeds the wavelength of the beam of light, and further includes at least one sub-wavelength grating that comprises a second array of features and spaces having a second pitch that is smaller than the wavelength of the beam of light,
the light sensor further configured to detect an intensity of light diffracted from a non-zero order of light received from a second beam substantially the same as the first beam after diffraction from a reference structure on the substrate,
wherein the reference structure comprises a super-wavelength grating substantially the same as the super wavelength grating of the experimental structure but does not comprise the sub-wavelength grating; and
a processor configured to compare an intensity of a non-zero order of light diffracted from the experimental grating and the reference grating and to calculate the critical dimension of features in the sub-wavelength grating according to the detected intensities, a grating depth, and the first pitch.

15. The system of claim 14, wherein the experimental structure and the reference structure comprise patterned photoresist disposed on the substrate.

16. The method of claim 14, wherein the light sensor is an alignment sensor.

17. The system of claim 16, wherein the first beam and the second beam are one of a TM polarized beam of light and a TE polarized beam of light.

18. The system of claim 17, wherein the first wavelength is greater than about 500 nm.

19. The system of claim 14, wherein the first array of features comprises a plurality of first lines that are separated by partially filled spaces, wherein the second array of features comprise a plurality of second lines and second spaces, the plurality of second lines and second spaces located within the partially filled spaces.

\* \* \* \* \*